US012672422B2

(12) United States Patent
Chung et al.

(10) Patent No.: US 12,672,422 B2
(45) Date of Patent: Jun. 30, 2026

(54) MULTI-LAYERED FILM AND SOLAR CELL PACKAGE STRUCTURE

(71) Applicant: INDUSTRIAL TECHNOLOGY RESEARCH INSTITUTE, Hsinchu (TW)

(72) Inventors: Li-Han Chung, Miaoli City (TW); Mei-Chun Lai, Zhubei City (TW); Sheng-Yang Liu, Kaohsiung City (TW); Hung-Chin Shen, Zhudong Township (TW); Po-Ling Shiao, Zhubei City (TW); Pei-Yin Chen, Taipei City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 8 days.

(21) Appl. No.: 19/002,250

(22) Filed: Dec. 26, 2024

(65) Prior Publication Data

US 2026/0143896 A1 May 21, 2026

(30) Foreign Application Priority Data

Nov. 19, 2024 (TW) ................................ 113144452

(51) Int. Cl.
*H10K 30/88* (2023.01)
*B32B 27/30* (2006.01)
(Continued)

(52) U.S. Cl.
CPC ........... *H10K 30/88* (2023.02); *H10F 19/804* (2025.01); *B32B 27/306* (2013.01); *B32B 27/32* (2013.01);
(Continued)

(58) Field of Classification Search
CPC ........ H10F 19/804; H10F 19/80; H10F 19/85; H10K 30/88; H10K 30/50; H10K 50/844;
(Continued)

(56) References Cited

U.S. PATENT DOCUMENTS

| | | | | |
|---|---|---|---|---|
| 5,650,243 | A * | 7/1997 | Ferment | H01M 50/121 429/185 |
| 6,313,241 | B1 | 11/2001 | Gauthier et al. | |

(Continued)

FOREIGN PATENT DOCUMENTS

| | | |
|---|---|---|
| CN | 103081121 B | 6/2016 |
| CN | 105593295 B | 1/2018 |

(Continued)

OTHER PUBLICATIONS

CN 116535983A English machine translation (Year: 2023).*
Taiwanese Office Action and Search Report for Taiwanese Application No. 113144452, dated Jul. 2, 2025.

*Primary Examiner* — Andrew J Golden
(74) *Attorney, Agent, or Firm* — Birch, Stewart, Kolasch & Birch, LLP

(57) ABSTRACT

A multi-layered film includes (A) an oxygen barrier layer; (B) a moisture barrier layer disposed on and in direct contact with (A) the oxygen barrier layer; and (C) an adhesive layer disposed on and in direct contact with (B) the moisture barrier layer. (A) The oxygen barrier layer includes (a) modified polyethylene resin and (e) ethylene-vinyl alcohol copolymer. (B) The moisture barrier layer includes (bi) first poly(ethylene-co-1-octene) having a melting index of 20 g/10 min to 40 g/10 min at 190° C. and (b2) second poly(ethylene-co-1-octene) having a melting index of 1 g/10 min to 10 g/10 min at 190° C. (C) The adhesive layer includes poly(ethylene-co-methacrylate-co-glycidyl methacrylate) having a melting index of 1 g/10 min to 10 g/10 min at 190° C.

10 Claims, 1 Drawing Sheet

100

(51) Int. Cl.
*B32B 27/32* (2006.01)
*H10F 19/80* (2025.01)

(52) U.S. Cl.
CPC ................. *B32B 2307/7244* (2013.01); *B32B 2307/7246* (2013.01); *B32B 2457/12* (2013.01)

(58) Field of Classification Search
CPC ....... B32B 27/08; B32B 27/32; B32B 27/306; B32B 2307/7244; B32B 2250/24; B32B 2250/242; B32B 2250/246; B32B 2329/04; B32B 2457/12
See application file for complete search history.

(56) References Cited

U.S. PATENT DOCUMENTS

| | | | | |
|---|---|---|---|---|
| 8,592,679 | B2 | 11/2013 | Patel et al. | |
| 11,578,196 | B2 | 2/2023 | Wang et al. | |
| 2007/0251572 | A1* | 11/2007 | Hoya | B32B 5/18 174/110 SR |
| 2008/0078445 | A1* | 4/2008 | Patel | H10F 19/804 136/256 |
| 2009/0176117 | A1 | 7/2009 | Gkinosatis | |
| 2012/0152323 | A1* | 6/2012 | Perry | B32B 27/16 156/60 |
| 2013/0092228 | A1 | 4/2013 | Pawlik et al. | |
| 2013/0213476 | A1 | 8/2013 | Otsuka et al. | |
| 2014/0072674 | A1 | 3/2014 | Holinda, Jr. et al. | |
| 2014/0134446 | A1* | 5/2014 | Siddiqui | B32B 27/32 428/476.3 |

FOREIGN PATENT DOCUMENTS

| | | | | |
|---|---|---|---|---|
| CN | 110713803 | A | 1/2020 | |
| CN | 113871236 | A | 12/2021 | |
| CN | 114619734 | B | 9/2022 | |
| CN | 115103768 | A | 9/2022 | |
| CN | 115610054 | A | 1/2023 | |
| CN | 113801584 | B | 4/2023 | |
| CN | 116535983 | A * | 8/2023 | H10F 19/804 |
| CN | 116554550 | A | 8/2023 | |
| WO | WO 2010/124189 | A1 | 10/2010 | |

* cited by examiner

MULTI-LAYERED FILM AND SOLAR CELL PACKAGE STRUCTURE

CROSS REFERENCE TO RELATED APPLICATIONS

The present application is based on, and claims priority from, Taiwan Application Serial Number 113144452, filed on Nov. 19, 2024, the disclosure of which is hereby incorporated by reference herein in its entirety.

TECHNICAL FIELD

The technical field relates to a multi-layered film, and a solar cell package structure.

BACKGROUND

Perovskite solar cells (PSCs) can be connected in series with traditional silicon solar cells to make full use of sunlight to improve sunlight utilization. However, the perovskite material is sensitive to heat, environmental moisture, and oxygen. As such, a packaging material for the perovskite material has many limitations. The water and oxygen barrier properties of the packaging material are quite important. Accordingly, enhancing the abilities of the packaging material to form a barrier against water and oxygen is critical for PSCs.

SUMMARY

One embodiment of the disclosure provides a multi-layered film, including (A) an oxygen barrier layer; (B) a moisture barrier layer disposed on and in direct contact with (A) the oxygen barrier layer; and (C) an adhesive layer disposed on and in direct contact with (B) the moisture barrier layer. (A) The oxygen barrier layer includes (a) modified polyethylene resin and (e) ethylene-vinyl alcohol copolymer. (B) The moisture barrier layer includes (b1) first poly(ethylene-co-1-octene) having a melting index of 20 g/10 min to 40 g/10 min at 190° C. and (b2) second poly(ethylene-co-1-octene) having a melting index of 1 g/10 min to 10 g/10 min at 190° C. (C) The adhesive layer includes a poly(ethylene-co-methacrylate-co-glycidyl methacrylate) having a melting index of 1 g/10 min to 10 g/10 min at 190° C.

In some embodiments of the disclosure provides a solar cell package structure, including a solar cell; the described multi-layered film packaging the solar cell; and a cap disposed on the multi-layered film, wherein (A) the oxygen barrier layer of the multi-layered film is in direct contact with the solar cell, and (C) the adhesive layer of the multi-layered film is in direct contact with the cap.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
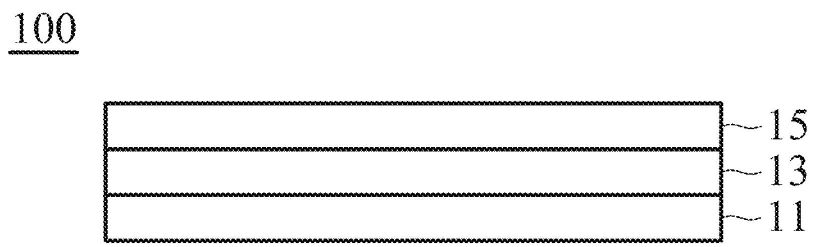
FIG. 1 shows a multi-layered film in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As shown in FIG. 1, one embodiment of the disclosure provides a multi-layered film 100, including (A) an oxygen barrier layer 11; (B) a moisture barrier layer 13 disposed on and in direct contact with (A) the oxygen barrier layer 11; and (C) an adhesive layer 15 disposed on and in direct contact with (B) the moisture barrier layer 13. The arrangement order of the layers is necessary. For example, if (A) the oxygen barrier layer 11 is disposed between (B) the moisture barrier layer 13 and (C) the adhesive layer 15, (B) the moisture barrier layer and a component (e.g., a solar cell) contact with (B) the moisture barrier layer will have an insufficient adhesion therebetween. If (C) the adhesive layer 15 is disposed between (A) the oxygen barrier layer and (B) the moisture barrier layer 13, (B) the moisture barrier layer and a component formed thereon (e.g., a cap) will have an insufficient adhesion therebetween. On the other hand, if the compositions of (A) the oxygen barrier layer and (B) the moisture barrier layer are blended rather than separated as the different layers, the single layer of the blend will be opaque and cannot be used to package the solar cell.

In some embodiments, (A) the oxygen barrier layer 11 includes (a) modified polyethylene resin and (e) ethylene-vinyl alcohol copolymer. In some embodiments, (a) the modified polyethylene resin includes (a1) ethylene-glycidyl methacrylate copolymer, (a2) ethylene-acrylic acid copolymer, (a3) ethylene-methyl acrylate-maleic anhydride copolymer, or a combination thereof. For example, (a1) the ethylene-glycidyl methacrylate copolymer can be LOTADER® AX8840 commercially available from Arkema, IGETABOND™ BF-2C or GETABOND™ BF-E commercially available from Sumitomo Chemical, or a combination thereof. For example, (a2) the ethylene-acrylic acid copolymer can be Nucrel 925 commercially available from Dow Chemical, Nucrel 960 commercially available from Dow Chemical, Nucrel 596 commercially available from Dow Chemical, or a combination thereof. For example, (a3) the ethylene-methyl acrylate-maleic anhydride copolymer can be LOTADER®4503 commercially available from Arkema, LOTADER®4403 commercially available from Arkema, LOTADER®4513T commercially available from Arkema, or a combination thereof. In some embodiments, (a) the modified polyethylene resin and (e) the ethylene-vinyl alcohol copolymer have a weight ratio of 70:30 to 95:5. If the amount of (a) the modified polyethylene resin is too low, (A) the oxygen barrier layer 11 will be too hard to attach (B) the moisture barrier layer 13. If the amount of (a) the modified polyethylene resin is too high, the oxygen barrier effect of (A) the oxygen barrier layer will be poor. In some embodiments, (A) the oxygen barrier layer 11 has a thickness of 50 micrometers to 300 micrometers, or 100 micrometers to 300 micrometers. If (A) the oxygen barrier layer is too thin, the oxygen barrier effect of (A) the oxygen barrier layer 11 will be insufficient. If (A) the oxygen barrier layer 11 is too thick, the flexibility of the overall film will be insufficient.

In some embodiments, (B) the moisture barrier layer includes (b1) first poly(ethylene-co-1-octene) having a melting index of 20 g/10 min to 40 g/10 min at 190° C. and (b2) second poly(ethylene-co-1-octene) having a melting index of 1 g/10 min to 10 g/10 min at 190° C. For example, (b1) the first poly(ethylene-co-1-octene) can be Engage™ 8401 commercially available from Dow Chemical, Engage™

8402 commercially available from Dow Chemical, or a combination thereof. For example, (b2) the second poly (ethylene-co-1-octene) can be Engage™ 8450 commercially available from Dow Chemical, Engage™ 8540 commercially available from Dow Chemical, or a combination thereof. In some embodiments, (b1) the first poly(ethylene-co-1-octene) and (b2) the second poly(ethylene-co-1-octene) have a weight ratio of 85:15 to 65:35, or 80:20 to 70:30. If the amount of (b1) the first poly(ethylene-co-1-octene) is too low, the paging ability of (B) the moisture barrier layer will be insufficient. If the amount of (b1) the first poly(ethylene-co-1-octene) is too high, the thermal resistance of (B) the moisture barrier layer will be insufficient. In some embodiments, (B) the moisture barrier layer 13 has a thickness of 100 micrometers to 300 micrometers. If (B) the moisture barrier layer 13 is too thin, the moisture barrier effect of (B) the moisture barrier layer will be poor. If (B) the moisture barrier layer 13 is too thick, the multi-layered film will be too thick.

In some embodiments, (C) the adhesive layer includes poly(ethylene-co-methacrylate-co-glycidyl methacrylate) having a melting index of 1 g/10 min to 10 g/10 min at 190° C. If another material such as ethylene-glycidyl methacrylate copolymer is selected to serve as (C) the adhesive layer, the adhesion property will be poor. If the melting index of the poly(ethylene-co-methacrylate-co-glycidyl methacrylate) is too low, the packaging ability will be insufficient. If the melting index of the poly(ethylene-co-methacrylate-co-glycidyl methacrylate) is too high, the anti-creep property will be poor. In some embodiments, (C) the adhesive layer 15 has a thickness of 100 micrometers to 300 micrometers. If (C) the adhesive layer is too thin, the adhesion effect will be poor. If (C) the adhesive layer is too thick, the thickness of the multi-layered film will be excessive.

In some embodiments, (A) the oxygen barrier layer 11, (B) the moisture barrier layer 13, and (C) the adhesive layer 15 are respectively formed, and then the three layers are stacked and thermal pressed to form the multi-layered film 100. Alternatively, the multi-layered film 100 can be formed by co-extrusion.

Figure 2:
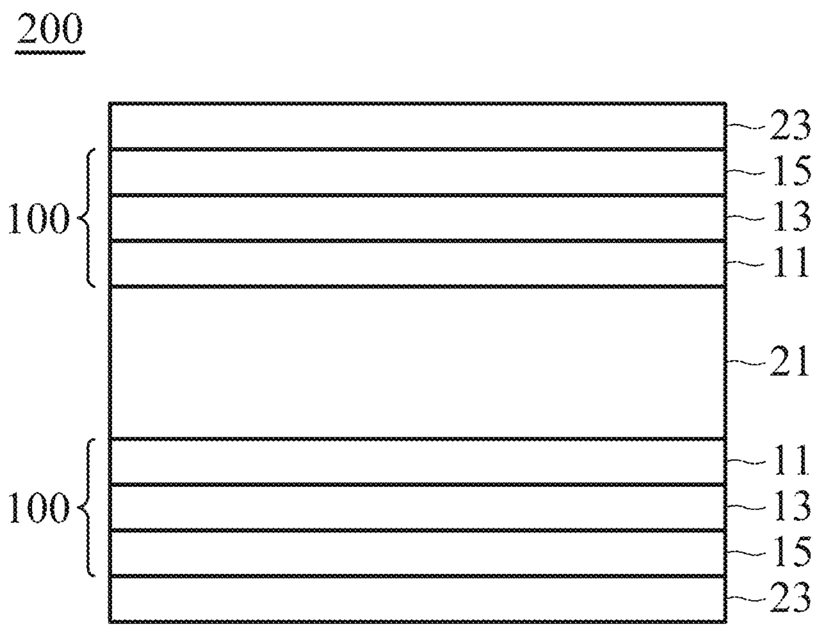
FIG. 2 shows a solar cell package structure in one embodiment of the disclosure.

The multi-layered film 100 can be used in a solar cell package structure 200, as shown in FIG. 2. It should be understood that the multi-layered film 100 can be used in another device; it is not limited to the solar cell package structure 200.

As shown in FIG. 2, the solar cell package structure 200 includes a solar cell 21; the described multi-layered film 100 packaging the solar cell 21; and a cap 23 disposed on the multi-layered film 100. (A) The oxygen barrier layer 11 of the multi-layered film 100 is in direct contact with the solar cell 21, and (C) the adhesive layer 15 of the multi-layered film 100 is in direct contact with the cap 23. As shown in FIG. 2, the solar cell package structure 200 may include another multi-layered film 100 underlying the solar cell 21; and another cap 23 disposed under the other multi-layered film 100. Similarly, (A) the oxygen barrier layer 11 of the other multi-layered film 100 is in direct contact with the solar cell 21, and (C) the adhesive layer 15 of the other multi-layered film 100 is in direct contact with the other cap 23. In some embodiments, the multi-layered films 21 overlying and underlying the solar cell 21 can be the same or different, depending upon the requirements. In some embodiments, the caps 23 overlying and underlying the solar cell 21 can be the same or different, depending upon the requirements.

In some embodiments, the cap 23 includes a glass cap. In some embodiments, the solar cell 21 includes a perovskite solar cell or an n-type silicon solar cell.

The multi-layered film simultaneously satisfies the requirements for a low moisture transmission rate, excellent oxygen barrier properties, and flexibility. As such, the solar cell package structure utilizing the multi-layered film has a high stability and a long lifespan.

Below, exemplary embodiments are described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Example 1

Engage™ 8401 having a melting index of 30 g/10 min at 190° C. commercially available from Dow Chemical was selected to serve as (b1) first poly(ethylene-co-1-octene), and Engage™ 8450 having a melting index of 3 g/10 min at 190° C. commercially available from Dow Chemical was selected to serve as (b2) second poly(ethylene-co-1-octene). Different weight ratios of (b1) the first poly(ethylene-co-1-octene) and (b2) the second poly(ethylene-co-1-octene) were blended and then extruded to form films having a thickness of 200 micrometers to check their packaging ability and thermal resistance. The packaging ability means that the film should have a viscosity of less than 3000 Pa. s, in which the sample with a thickness of 1 mm was measured by a parallel-plate rheometer at a temperature of 120° C. and a frequency of 1 Hz. The thermal resistance means that the film should have a creep temperature of higher than 100° C., in which two glass sheets (5 cm*5 cm*3 mm) were attached by the film and vertically hung in a hot air oven. The glass sheets were heated until one glass sheet slid at least 1 mm, and this temperature was the creep temperature. The film formed of 100 parts by weight of (b1) the first poly(ethylene-co-1-octene) had the packaging ability but no thermal resistance. The film formed of a blend of 90 parts by weight of (b1) the first poly(ethylene-co-1-octene) and 10 parts by weight of (b2) the second poly(ethylene-co-1-octene) had the packaging ability but no thermal resistance. The film formed of a blend of 80 parts by weight of (b1) the first poly(ethylene-co-1-octene) and 20 parts by weight of (b2) the second poly(ethylene-co-1-octene) had the packaging ability and the thermal resistance. The film formed of a blend of 70 parts by weight of (b1) the first poly(ethylene-co-1-octene) and 30 parts by weight of (b2) the second poly (ethylene-co-1-octene) had the packaging ability but no thermal resistance. The film formed of a blend of 60 parts by weight of (b1) the first poly(ethylene-co-1-octene) and 40 parts by weight of (b2) the second poly(ethylene-co-1-octene) had the thermal resistance but no packaging ability. The film formed of 100 parts by weight of (b2) the second poly(ethylene-co-1-octene) had the thermal resistance but no packaging ability. In following Examples, the film formed of a blend of 70 parts by weight of (b1) the first poly(ethylene-co-1-octene) and 30 parts by weight of (b2) the second poly(ethylene-co-1-octene) was selected to serve as (B) the moisture barrier layer.

Engage™ 8401 was composed of a repeating unit $$-\!\!\left[CH_2-CH_2\right]\!\!-$$

and a repeating unit

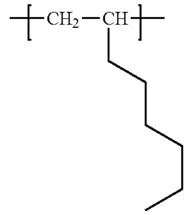

, wherein the repeating unit $$-\!\!\left[CH_2-CH_2\right]\!\!-$$

and the repeating unit

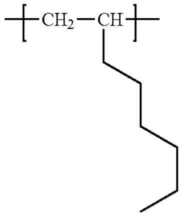

had a weight ratio of 69:31. On the other hand, the copolymer was a random copolymer rather than a block copolymer. Engage™ 8450 was composed of a repeating unit $$-\!\!\left[CH_2-CH_2\right]\!\!-$$

and a repeating unit

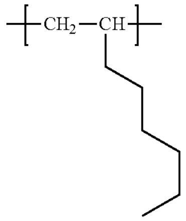

, wherein the repeating unit $$-\!\!\left[CH_2-CH_2\right]\!\!-$$

and the repeating unit

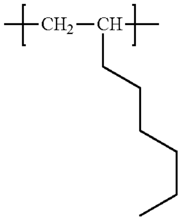

had a weight ratio of 80:20. On the other hand, the copolymer was a random copolymer rather than a block copolymer.

Example 2

LOTADER® AX8840 commercially available from Arkema (e.g., (a1) ethylene-glycidyl methacrylate copolymer) was selected to serve as (a) modified polyethylene resin, and EV4451 commercially available from CHANG CHUN PETROCHEMICAL CO., LTD. (e.g., ethylene-vinyl alcohol copolymer, ethylene segments occupied 44 mol %) was selected to serve as (e) ethylene-vinyl alcohol copolymer. Different weight ratios of (a1) the ethylene-glycidyl methacrylate copolymer and (e) the ethylene-vinyl alcohol copolymer were blended and then extruded to form films having a thickness of 200 micrometers, and each of the films was then attached to (B) the moisture barrier layer in Example 1 (e.g., the blend of 70 parts by weight of (b1) the first poly(ethylene-co-1-octene) and 30 parts by weight of (b2) the second poly(ethylene-co-1-octene), and the film thickness was 200 micrometers) to check their peeling strength to (B) the moisture barrier layer in Example 1. The peeling strength was measured according to the standard ASTM D3330. The film formed of 100 parts by weight of (a1) the ethylene-glycidyl methacrylate copolymer had a peeling strength of 12.7 N/15 mm. The film formed of a blend of 85 parts by weight of (a1) the ethylene-glycidyl methacrylate copolymer and 15 parts by weight of (e) the ethylene-vinyl alcohol copolymer had a peeling strength of 10.9 N/15 mm. The film formed of a blend of 70 parts by weight of (a1) the ethylene-glycidyl methacrylate copolymer and 30 parts by weight of (e) the ethylene-vinyl alcohol copolymer had a peeling strength of 8.8 N/15 mm. The film formed of a blend of 50 parts by weight of (a1) the ethylene-glycidyl methacrylate copolymer and 50 parts by weight of (e) the ethylene-vinyl alcohol copolymer had a peeling strength of 4.5 N/15 mm. The film formed of a blend of 40 parts by weight of (a1) the ethylene-glycidyl methacrylate copolymer and 60 parts by weight of (e) the ethylene-vinyl alcohol copolymer had a peeling strength of 3.5 N/15 mm. The film formed of a blend of 30 parts by weight of (a1) the ethylene-glycidyl methacrylate copolymer and 70 parts by weight of (e) the ethylene-vinyl alcohol copolymer had a peeling strength of 2.5 N/15 mm. The film formed of 100 parts by weight of (e) the ethylene-vinyl alcohol copolymer had a peeling strength of 0.12 N/15 mm. As shown above, when the content of (e) the ethylene-vinyl copolymer in (A) the oxygen barrier layer is more than 30% by weight, it will cause a decrease in the adhesion strength between (A) the oxygen barrier layer and (B) the moisture barrier layer, which may result in delamination during packaging.

LOTADER® AX8840 commercially available from Arkema was composed of a repeating unit $$-\!\!\!+CH_2-CH_2+\!\!\!-$$

and a repeating unit

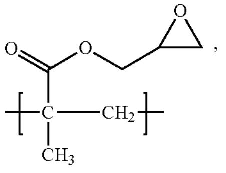

wherein the repeating unit $$-\!\!\!+CH_2-CH_2+\!\!\!-$$

and the repeating unit

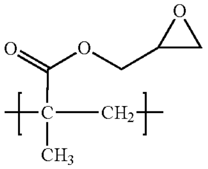

had a weight ratio of 92:8. On the other hand, the copolymer was a random copolymer rather than a block copolymer. EV4451 was composed of a repeating unit $$-\!\!\!+CH_2-CH_2+\!\!\!-$$

and a repeating unit

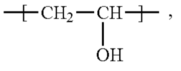

wherein the repeating unit $$-\!\!\!+CH_2-CH_2+\!\!\!-$$

and the repeating unit

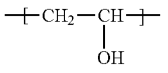

had a weight ratio of 44:56. On the other hand, the copolymer was a random copolymer rather than a block copolymer.

Example 3

LOTADER® AX8840 commercially available from Arkema (e.g., (a1) ethylene-glycidyl methacrylate copolymer) was selected to serve as (a) modified polyethylene resin, and EV4451 commercially available from CHANG CHUN PETROCHEMICAL CO., LTD. was selected to serve as (e) ethylene-vinyl alcohol copolymer. Different weight ratios of (a1) the ethylene-glycidyl methacrylate copolymer and (e) the ethylene-vinyl alcohol copolymer were blended and then extruded to form films having a thickness of 200 micrometers, and each of the films was then attached to (B) the moisture barrier layer in Example 1 (e.g., the blend of 70 parts by weight of (b1) the first poly (ethylene-co-1-octene) and 30 parts by weight of (b2) the second poly(ethylene-co-1-octene), and the film thickness was 200 micrometers) to form multi-layered films. The transparency (should be higher than 85%) of the multi-layered film was measured by a haze meter NDH 2000 commercially available from NIPPON DENSHOKU according the standard ASTM D1003. The oxygen transmission rate (OTR) of the multi-layered film was measured according to the standard ASTM F1307. The water vapor transmission rate (WVTR) of the multi-layered film was measured according to the standard ASTM F1249 38° C./100% RH). The Young's modulus of the multi-layered film was measured according the standard ASTM D638.

The multi-layered film of (A) the oxygen layer, formed of 100 parts by weight of (a1) the ethylene-glycidyl methacrylate copolymer, and (B) the moisture barrier layer had excellent transparency, an OTR of 608 cc/m$^2$·day, a WVTR of 1.94 g/m$^2$·day, and a Young's modulus of 29.0 MPa. The multi-layered film of (A) the oxygen layer, formed of a blend of 85 parts by weight of (a1) the ethylene-glycidyl methacrylate copolymer and 15 parts by weight of (e) the ethylene-vinyl alcohol copolymer, and (B) the moisture barrier layer had excellent transparency, an OTR of 551 cc/m$^2$·day, a WVTR of 1.82 g/m$^2$·day, and a Young's modulus of 33.2 MPa. The multi-layered film of (A) the oxygen layer, formed of a blend of 70 parts by weight of (a1) the ethylene-glycidyl methacrylate copolymer and 30 parts by weight of (e) the ethylene-vinyl alcohol copolymer, and (B) the moisture barrier layer had excellent transparency, an OTR of 394 cc/m$^2$·day, a WVTR of 1.74 g/m$^2$·day, and a Young's modulus of 35.2 MPa.

Example 4

Nucrel 925 commercially available form Dow Chemical (e.g., (a2) ethylene-acrylic acid copolymer) was selected to serve as (a) modified polyethylene resin, and EV4451 commercially available from CHANG CHUN PETROCHEMICAL CO., LTD. was selected to serve as (e) ethylene-vinyl alcohol copolymer. Different weight ratios of (a2) the ethylene-acrylic acid copolymer and (e) the ethylene-vinyl alcohol copolymer were blended and then extruded to form films having a thickness of 200 micrometers, and each of the films was then attached to (B) the moisture barrier layer in Example 1 (e.g., the blend of 70 parts by weight of (b1) the first poly(ethylene-co-1-octene) and 30 parts by weight of (b2) the second poly(ethylene-co-1-octene), and the film thickness was 200 micrometers) to form multi-layered films. The transparency (should be higher than 85%) of the multi-layered film was measured by a haze meter NDH 2000 commercially available from NIPPON DENSHOKU according the standard ASTM D1003. The oxygen transmission rate (OTR) of the multi-layered film was measured according to the standard ASTM F1307. The water vapor transmission rate (WVTR) of the multi-layered film was measured according to the standard ASTM F1249 38° C./100% RH). The Young's modulus of the multi-layered film was measured according the standard ASTM D638.

The multi-layered film of (A) the oxygen layer, formed of 100 parts by weight of (a2) the ethylene-acrylic acid copolymer, and (B) the moisture barrier layer had excellent transparency, an OTR of 313 cc/m$^2$·day, a WVTR of 1.38 g/m$^2$·day, and a Young's modulus of 40.6 MPa. The multi-layered film of (A) the oxygen layer, formed of a blend of 85 parts by weight of (a2) the ethylene-acrylic acid copolymer and 15 parts by weight of (e) the ethylene-vinyl alcohol copolymer, and (B) the moisture barrier layer had excellent transparency, an OTR of 269 cc/m$^2$·day, a WVTR of 1.31 g/m$^2$·day, and a Young's modulus of 43.1 MPa. The multi-layered film of (A) the oxygen layer, formed of a blend of 70 parts by weight of (a2) the ethylene-acrylic acid copolymer and 30 parts by weight of (e) the ethylene-vinyl alcohol copolymer, and (B) the moisture barrier layer had excellent transparency, an OTR of 224 cc/m$^2$·day, a WVTR of 1.06 g/m$^2$·day, and a Young's modulus of 45.2 MPa.

Nucrel 925 was composed of a repeating unit

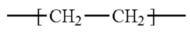

and a repeating unit

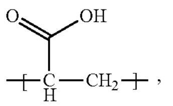

wherein the repeating unit

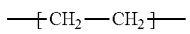

and the repeating unit

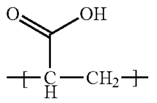

had a weight ratio of 85:15. On the other hand, the copolymer was a random copolymer rather than a block copolymer.

Example 5

LOTADER®4503 commercially available from Arkema (e.g., (a3) ethylene-methyl acrylate-maleic anhydride copolymer) was selected to serve as (a) modified polyethylene resin, and EV4451 commercially available from CHANG CHUN PETROCHEMICAL CO., LTD. was selected to serve as (e) ethylene-vinyl alcohol copolymer. Different weight ratios of (a3) the ethylene-methyl acrylate-maleic anhydride copolymer and (e) the ethylene-vinyl alcohol copolymer were blended and then extruded to form films having a thickness of 200 micrometers, and each of the films was then attached to (B) the moisture barrier layer in Example 1 (e.g., the blend of 70 parts by weight of (b1) the first poly(ethylene-co-1-octene) and 30 parts by weight of (b2) the second poly(ethylene-co-1-octene), and the film thickness was 200 micrometers) to form multi-layered films. The transparency (should be higher than 85%) of the multi-layered film was measured by a haze meter NDH 2000 commercially available from NIPPON DENSHOKU according the standard ASTM D1003. The oxygen transmission rate (OTR) of the multi-layered film was measured according to the standard ASTM F1307. The water vapor transmission rate (WVTR) of the multi-layered film was measured according to the standard ASTM F1249 38° C./100% RH). The Young's modulus of the multi-layered film was measured according the standard ASTM D638.

The multi-layered film of (A) the oxygen layer, formed of 100 parts by weight of (a3) the ethylene-methyl acrylate-maleic anhydride copolymer, and (B) the moisture barrier layer had excellent transparency, an OTR of 823 cc/m$^2$·day, a WVTR of 2.79 g/m$^2$·day, and a Young's modulus of 22.8 MPa. The multi-layered film of (A) the oxygen layer, formed of a blend of 85 parts by weight of (a3) the ethylene-methyl acrylate-maleic anhydride copolymer and 15 parts by weight of (e) the ethylene-vinyl alcohol copolymer, and (B) the moisture barrier layer had excellent transparency, an OTR of 789 cc/m$^2$·day, a WVTR of 2.47 g/m$^2$·day, and a Young's modulus of 24.5 MPa. The multi-layered film of (A) the oxygen layer, formed of a blend of 70 parts by weight of (a3) the ethylene-methyl acrylate-maleic anhydride copolymer and 30 parts by weight of (e) the ethylene-vinyl alcohol copolymer, and (B) the moisture barrier layer had excellent transparency, an OTR of 617 cc/m$^2$·day, a WVTR of 2.55 g/m$^2$·day, and a Young's modulus of 24.7 MPa.

LOTADER® Lotader 4503 commercially available from Arkema was composed of a repeating unit

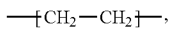

a repeating unit

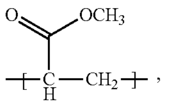

and a repeating unit

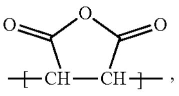

wherein the repeating unit

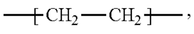

the repeating unit

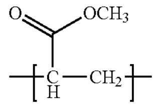, and the repeating unit

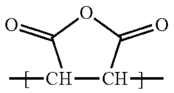

had a weight ratio of 97.7:20:0.3. On the other hand, the copolymer was a random copolymer rather than a block copolymer.

Example 6

LOTADER® AX8840 commercially available from Arkema (e.g., (a1) ethylene-glycidyl methacrylate copolymer) was selected to serve as (a) modified polyethylene resin, and EV3251 commercially available from CHANG CHUN PETROCHEMICAL CO., LTD. (e.g., ethylene-vinyl alcohol copolymer, ethylene segments occupied 32 mol %) was selected to serve as (e) ethylene-vinyl alcohol copolymer. Different weight ratios of (a1) the ethylene-glycidyl methacrylate copolymer and (e) the ethylene-vinyl alcohol copolymer were blended and then extruded to form films having a thickness of 200 micrometers, and each of the films was then attached to (B) the moisture barrier layer in Example 1 (e.g., the blend of 70 parts by weight of (b1) the first poly(ethylene-co-1-octene) and 30 parts by weight of (b2) the second poly(ethylene-co-1-octene), and the film thickness was 200 micrometers) to form multi-layered films. The transparency (should be higher than 85%) of the multi-layered film was measured by a haze meter NDH 2000 commercially available from NIPPON DENSHOKU according the standard ASTM D1003. The oxygen transmission rate (OTR) of the multi-layered film was measured according to the standard ASTM F1307. The water vapor transmission rate (WVTR) of the multi-layered film was measured according to the standard ASTM F1249 38° C./100% RH). The Young's modulus of the multi-layered film was measured according the standard ASTM D638.

The multi-layered film of (A) the oxygen layer, formed of 100 parts by weight of (a1) the ethylene-glycidyl methacrylate copolymer, and (B) the moisture barrier layer had excellent transparency, an OTR of 608 cc/$m^2$ day, a WVTR of 1.94 g/$m^2$ day, and a Young's modulus of 29.0 MPa. The multi-layered film of (A) the oxygen layer, formed of a blend of 85 parts by weight of (a1) the ethylene-glycidyl methacrylate copolymer and 15 parts by weight of (e) the ethylene-vinyl alcohol copolymer, and (B) the moisture barrier layer had excellent transparency, an OTR of 467 cc/$m^2$·day, a WVTR of 1.54 g/$m^2$·day, and a Young's modulus of 36.8 MPa. The multi-layered film of (A) the oxygen layer, formed of a blend of 70 parts by weight of (a1) the ethylene-glycidyl methacrylate copolymer and 30 parts by weight of (e) the ethylene-vinyl alcohol copolymer, and (B) the moisture barrier layer had excellent transparency, an OTR of 351 cc/$m^2$·day, a WVTR of 1.50 g/$m^2$·day, and a Young's modulus of 40.9 MPa.

Comparative Example 1

LOTADER® AX8900 commercially available from Arkema (e.g., poly(ethylene-co-methacrylate-co-glycidyl methacrylate)) was selected to serve as a modified polyethylene resin, and EV4451 commercially available from CHANG CHUN PETROCHEMICAL CO., LTD. was selected to serve as (e) ethylene-vinyl alcohol copolymer. 85 parts by weight of the modified polyethylene resin and 15 parts by weight of (e) the ethylene-vinyl alcohol copolymer were blended and then extruded to form (A) the oxygen barrier layer having a thickness of 200 micrometers. However, (A) the oxygen barrier layer has a poor transparency and could not be used in a multi-layered film.

LOTADER® AX8900 commercially available from Arkema was composed of a repeating unit $$-[CH_2-CH_2]-,$$

a repeating unit

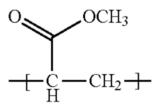, and a repeating unit

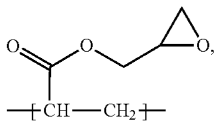, wherein the repeating unit $$-[CH_2-CH_2]-,$$

the repeating unit

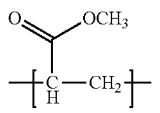, and the repeating unit

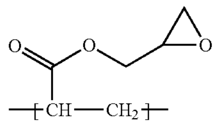

had a weight ratio of 68:24:8. On the other hand, the copolymer was a random copolymer rather than a block copolymer.

Comparative Example 2

Orevac®T9304 commercially available from Arkema (e.g., ethylene-vinyl acetate-maleic anhydride copolymer) was selected to serve as a modified polyethylene resin, and EV4451 commercially available from CHANG CHUN PETROCHEMICAL CO., LTD. was selected to serve as (e) ethylene-vinyl alcohol copolymer. 85 parts by weight of the modified polyethylene resin and 15 parts by weight of (e) the ethylene-vinyl alcohol copolymer were blended and then extruded to form (A) the oxygen barrier layer having a thickness of 200 micrometers. However, (A) the oxygen barrier layer has a poor transparency and could not be used in a multi-layered film.

Orevac®T9304 commercially available from Arkema was composed of a repeating unit

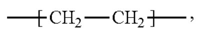, a repeating unit

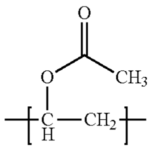, and a repeating unit

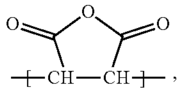, wherein the repeating unit

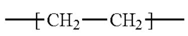, the repeating unit

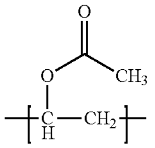, and the repeating unit

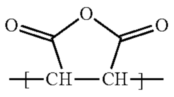

had a weight ratio of 74.4:25:0.16. On the other hand, the copolymer was a random copolymer rather than a block copolymer.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A multi-layered film, comprising:

(A) an oxygen barrier layer;

(B) a moisture barrier layer disposed on and in direct contact with (A) the oxygen barrier layer; and (C) an adhesive layer disposed on and in direct contact with (B) the moisture barrier layer, wherein (A) the oxygen barrier layer includes (a) modified polyethylene resin and (e) ethylene-vinyl alcohol copolymer;

wherein (B) the moisture barrier layer includes (b1) first poly(ethylene-co-1-octene) having a melting index of 20 g/10 min to 40 g/10 min at 190° C. and (b2) second poly(ethylene-co-1-octene) having a melting index of 1 g/10 min to 10 g/10 min at 190° C., and wherein (C) the adhesive layer includes poly(ethylene-co-methacrylate- co-glycidyl methacrylate) having a melting index of 1 g/10 min to 10 g/10 min at 190° C.

2. The multi-layered film as claimed in claim 1, wherein (a) the modified polyethylene resin and (e) the ethylene-vinyl alcohol copolymer have a weight ratio of 70:30 to 95:5.

3. The multi-layered film as claimed in claim 1, wherein (a) the modified polyethylene resin comprises (a1) ethylene-glycidyl methacrylate copolymer, (a2) ethylene-acrylic acid copolymer, (a3) ethylene-methyl acrylate-maleic anhydride copolymer, or a combination thereof.

4. The multi-layered film as claimed in claim 1, wherein (A) the oxygen barrier layer has a thickness of 50 micrometers to 300 micrometers.

5. The multi-layered film as claimed in claim 1, wherein (b1) the first poly(ethylene-co-1-octene) and (b2) the second poly(ethylene-co-1-octene) have a weight ratio of 85:15 to 65:35.

6. The multi-layered film as claimed in claim 1, wherein (B) the moisture barrier layer has a thickness of 100 micrometers to 300 micrometers.

7. The multi-layered film as claimed in claim 1, wherein (C) the adhesive layer has a thickness of 100 micrometers to 300 micrometers.

8. A solar cell package structure, comprising:

a solar cell;

the multi-layered film as claimed in claim 1 packaging the solar cell; and a cap disposed on the multi-layered film, wherein (A) the oxygen barrier layer of the multi-layered film is in direct contact with the solar cell, and (C) the adhesive layer of the multi-layered film is in direct contact with the cap.

9. The solar cell package structure as claimed in claim 8, wherein the cap comprises a glass cap.

10. The solar cell package structure as claimed in claim 8, wherein the solar cell comprises a perovskite solar cell or an n-type silicon solar cell.

* * * * *